United States Patent [19]

Melton et al.

[11] Patent Number: 5,429,292
[45] Date of Patent: Jul. 4, 1995

[54] TIN BISMUTH SOLDER PASTE, AND METHOD USING PASTE TO FORM CONNECTION HAVING IMPROVED HIGH TEMPERATURE PROPERTIES

[75] Inventors: Cynthia M. Melton, Bollingbrook; William Beckenbaugh; Dennis Miller, both of Barrington, all of Ill.

[73] Assignee: Motorola, Inc., Schaumburg, Ill.

[21] Appl. No.: 304,025

[22] Filed: Sep. 9, 1994

Related U.S. Application Data

[62] Division of Ser. No. 69,640, Jun. 1, 1993, Pat. No. 5,389,160.

[51] Int. Cl.⁶ ............................................. B23K 35/24
[52] U.S. Cl. ............................ 228/180.22; 228/262.9
[58] Field of Search .................... 228/180.22, 262.9; 148/24; 420/562

[56] References Cited

U.S. PATENT DOCUMENTS

| | | | |
|---|---|---|---|
| 4,170,472 | 10/1979 | Olsen | 420/562 |
| 4,236,922 | 2/1980 | Michl | 420/562 |
| 4,670,217 | 2/1987 | Henson | 420/562 |
| 4,806,309 | 2/1989 | Tulman | 420/562 |

OTHER PUBLICATIONS

American Society for Metals, "Soldering", *Welding, Braising and Soldering*, vol. 6, Metals Handbook, 9th Edition, 1983, pp. 1069 through 1076.

Murphy, Jim, "*Tin–Bismuth Alloy Plating, a Fusible Low Temperature Etch Resist for High Aspect Ratio PC Boards*", presented at IPC Fall Meeting, Oct. 7, 12, 1990, San Diego, Calif.

Prints, A. et al., *Phase Diagrams off Terniary Gold Alloys*, The Institute of Metals, London (1990).

Primary Examiner—Sam Silverberg
Attorney, Agent, or Firm—Douglas D. Fekete

[57] ABSTRACT

A solder paste of the type utilized in forming a solder onnectin for a microelectronic package comprises a mixture of compositionally distinct metal powders. The paste comprises a first metal powder formed of tin-bismuth solder alloy. The paste further comprises a second metal powder containing gold or silver. During reflow, the gold or silver alloys with the tin-bismuth solder to increase the melting part and enhance mechanical properties of the product connection.

6 Claims, 1 Drawing Sheet

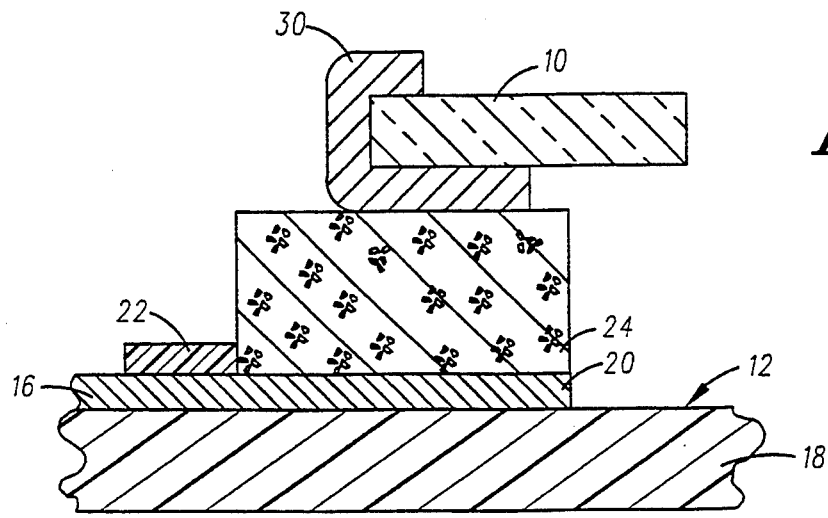
FIG.1
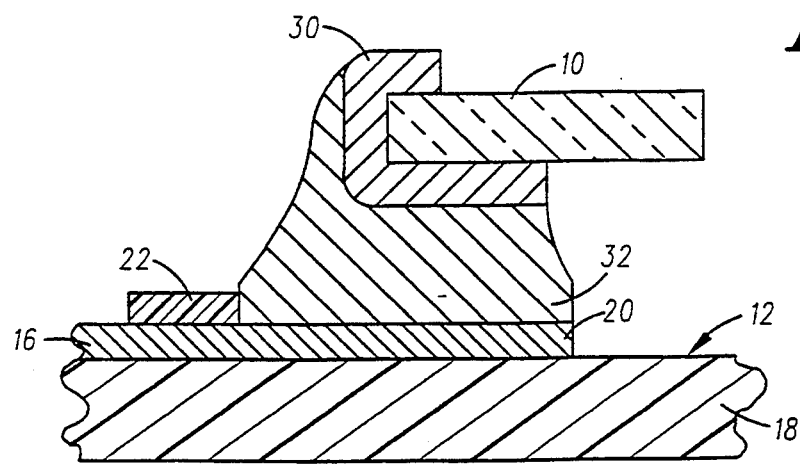
FIG.2
FIG.4
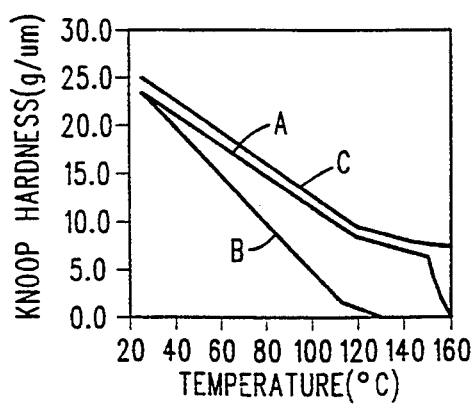
FIG.3
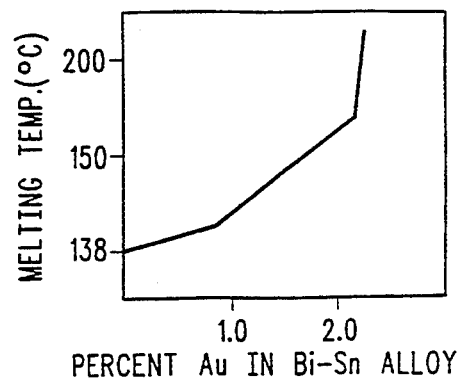

TIN BISMUTH SOLDER PASTE, AND METHOD USING PASTE TO FORM CONNECTION HAVING IMPROVED HIGH TEMPERATURE PROPERTIES

This is a division of application Ser. No. 08/069,640, filed on Jun. 1, 1993 now U.S. Pat. NO. 5,389,160.

BACKGROUND OF THE INVENTION

This invention relates to a solder paste for forming a tin-bismuth solder connection having enhanced high temperature properties. More particularly, this invention relates to a solder paste that comprises a mixture of tin-bismuth alloy powder and a powder of a tertiary metal, preferably gold or silver, effective to enhance the high temperature properties of the product connection.

Solder paste is employed to form a solder connection, for example, for surface mounting a component to a printed circuit board or the like. A typical paste comprises a powder formed of a solder alloy and dispersed in a liquid vehicle that contains a flux. The vehicle may also comprise an expendable organic binder to hold the powder in a self-sustaining mass following application. To form the connection, the board features a solder-wettable bond pad that constitutes a first faying surface. Similarly, the component includes a second, solder-wettable faying surface, for example, a contact. The solder paste is conveniently applied to the bond pad, for example, by screen printing, after which the component is arranged with the second faying surface in contact with the solder paste deposit. The assembly is then heated to vaporize the vehicle and to melt and reflow the solder alloy. Upon cooling, the solder alloy resolidifies and bonds to the faying surfaces to complete the connection. The solder connection not only physically attaches the component to the board, but also electrically connects the bond pad on the board and the contact of the component for conducting electrical current to or from the component for processing.

Common solder is formed of tin-lead alloy. It is proposed to form a lead-free solder connection composed of tin-bismuth alloy. However, tin-bismuth alloy tends to exhibit poor mechanical properties at elevated temperatures of the type encountered by microelectronic packages during use. In particular, such solder alloys tend to become unacceptably soft at temperatures as low as 100° C. and exhibit a relatively low melting temperature, particularly in comparison to the common tin-lead solders.

SUMMARY OF THE INVENTION

This invention contemplates a solder paste that includes a mixture of compositionally distinct metal powders that alloy to form the solder connection. Thus, the paste comprises a first metal powder that is formed of tin-bismuth solder alloy. The paste further comprises a second metal powder composed of a tertiary metal effective to increase the melting temperature and improve the mechanical properties of the tin-bismuth alloy. Preferred tertiary metal is gold or silver. In particular, it has been found that additions of gold between about 1.0 and 2.2 weight percent are effective to significantly improve the desired high temperature properties of the resulting connection.

In one aspect of this invention, a method is provided for forming a solder connection between solder-wettable faying surfaces, for example, between a bend pad of a printed circuit board and a contact of a component. The method comprises arranging the laying surfaces in contact with a deposit of the solder paste containing the mixture tin-bismuth solder alloy powder and the tertiary metal powder. The assembly is heated to melt the tin-bismuth solder alloy. Upon melting, the tin-bismuth powder coalesces to form a liquid solder that forms the basis for the solder connection. Concurrently, the tertiary metal of the second powder dissolves into the solder liquid. Upon cooling, the solder liquid solidifies and bonds to the laying surfaces to complete the solder connection. The solder connection exhibits enhanced high temperature mechanical properties, including an increased melting temperature, as a result of the alloying of the tertiary metal with the tin-bismuth alloy.

BRIEF DESCRIPTION OF THE DRAWINGS

The present invention will be further illustrated with reference to the accompanying drawings wherein:

FIG. 1 is a cross-sectional view of an assembly of a printed circuit board and an electrical component with a solder paste in accordance with this invention;

FIG. 2 is a cross-sectional view of the assembly in FIG. 1 following solder reflow to form a solder connection;

FIG. 3 is a graph showing melting temperature as a function of gold content in tin-bismuth solder alloy; and FIG. 4 is a graph showing Knoop hardness as a function of temperature for several solder alloys, including gold-containing tin-bismuth alloy formed from solder paste in accordance with this invention.

DETAILED DESCRIPTION OF THE PREFERRED EMBODIMENT

In a preferred embodiment, the solder paste in accordance with this invention is employed to form a lead-free solder connection for mounting an electrical component onto a printed circuit board. The paste is suitably formulated by addition of gold powder to commercial solder paste containing tin-bismuth solder powder. Preferred tin-bismuth solder powder consists of a near eutectic alloy composed of about 60 weight percent bismuth and the balance tin, and contains less than 0.1 percent lead as impurity. The tin-bismuth powder was sized between −200 and +325 mesh and is dispersed in a vehicle. The vehicle is composed of high boiling alcohols and glycol solvent and contains a flux consisting of a white rosin compound. The paste also includes an expendable organic binder, suitably ethyl cellulose compound, effective to bond the powder into a cohesive deposit. Suitable paste is commercially available from Indium Corporation of America under the trade designation Indalloy 281. Gold powder is added to the tin-bismuth solder paste to formulate the paste in accordance with this invention. The gold powder featured particles having dimensions between about 5 and 10 microns. The gold addition was calculated based upon the total weight of metal powder and is preferably between about 1.0 and 2.2 weight percent.

Referring to FIG. 1, there is depicted an assembly for mounting a discrete component 10, such as a resistor or the like, to a printed circuit board 12 utilizing solder paste in accordance with this invention. Printed circuit board 12 comprises a metallic copper trace 16 affixed to a dielectric substrate 18 of the type referred as an FR4 card and composed of an epoxy resin and glass fiber laminate. Trace 16 includes a surface mount pad 20 that is the site for attaching component 10. Board 12 further comprises a solder stop 22 composed of an epoxy-base or other suitable polymeric resin that provides a solder-nonwettable barrier. Solder stop 22 is applied to trace 16 to block the spread of solder alloy and thereby confine the solder alloy to bond pad 20 during reflow. A deposit 24 of the solder paste comprising the mixture of tin-bismuth solder powder and gold powder is applied to bond pad 20 by screen printing. Component 10 comprises a contact 30 formed of palladium-silver alloy, which constitutes a faying surface for the connection. Following deposition of the solder paste 24, component 10 is assembled with printed circuit board 12 such that contact 30 is in contact with deposit 24.

To complete the connection, the assembly shown in FIG. 1 is heated to a temperature greater than 140° C., and preferably greater than 160° C., to reflow the solder alloy. During the initial stages of heating, residual solvent and organic binder in the deposit 24 are decomposed and vaporized. As the assembly is heated above about 138.5° C., the eutectic melting temperature, the tin-bismuth particles dissolves and coalesce to produce a liquid phase. Concurrently, the liquid phase commences to melt the gold powder. At the elevated temperature, a uniform liquid forms that wets bond pad 20 and contact 30. Wetting is facilitated by the activity of the white rosin flux. The assembly is cooled to produce solder connection 32 in FIG. 2 that bends to bend pad 20 and to contact 30 and extends continuously there between to attach component 10 to board 12 and also to electrically connect pad 20 and contact 30. Connection 32 is composed substantially of tin and bismuth derived from the solder alloy of the first metal powder and contains gold derived from the second metal powder, preferably in an amount between about 1.0 and 2.2 weight percent.

Therefore, this invention provides a solder paste that includes a mixture of metal powders dispersed in a vaporizable vehicle. The mixture is formed predominantly of powder composed of a solder alloy of tin and bismuth. In general, tin alloys containing between about 30 and 70 weight percent bismuth have melting temperatures suitably low to permit reflow onto conventional substrate material like epoxy-base printed circuit boards, and are readily available in high purity that is substantially free of lead. The preferred alloy contains between about 48 and 68 weight percent bismuth. Optionally, the initial solder powder may include small amounts, typically less than 4%, of other alloy agents to enhance mechanical properties. The paste further comprises a minor addition of a second metal powder containing a tertiary metal to enhance mechanical properties of the tin-bismuth solder. Suitable tertiary metals for alloying with the tin-bismuth solder include gold and silver, with gold being preferred. Although the preferred embodiment the second metal powder is composed of the tertiary metal in neat form, the metal may be prealloyed, including with tin or bismuth. During heating to reflow the solder paste, the tin-bismuth powder initially melts and reflows. It is a significant advantage of this invention that the reflow of the tin-bismuth solder commences at a relatively low temperature, significantly less than the gold-containing alloy that forms the connection. This promotes wetting of the faying surfaces during the early stages of reflow, which wetting is essential to formation of a strong solder bond. Nevertheless, the tertiary metal eventually dissolves into the liquid phase and alloys with the tin and bismuth to form a connection having enhanced high temperature properties.

FIG. 3 is a graph showing melting temperature as a function of gold concentration in alloy composed of 58 weight percent bismuth and the balance tin. As can be seen, concentrations of gold of as little as 1 weight percent significantly increase the melting temperature of the alloy. Concentrations greater than about 2.2 weight percent have melting temperatures above about 210° C. In common practice solders are reflowed at temperatures that are 20° C. to 40° C. above the melting temperature to accelerate melting and reduce cycle time. Accordingly, alloys containing greater than about 2.2 weight percent gold necessitate high reflow temperatures that tend to damage other features typically found in electronic packages. Also, at higher gold concentrations, the formation of tin-gold intermetallic phases becomes significant and tends to diminish the mechanical properties of the connection. A preferred gold concentration in the product connection is between about 1.0 and 2.2 weight percent gold.

FIG. 5 shows a plot of Knoop hardness in grams per micron as a function of temperature. Curve A indicates Knoop hardness for an alloy comprising of about 2.0 weight percent gold, 58 weight percent bismuth and the balance tin, which alloy is produced by paste formulated in accordance with this invention. For purposes of comparison, curve B shows hardness for a comparable tin-bismuth alloy without gold, whereas curve C represents a standard tin-lead solder alloy composed of about 2 weight percent silver, about 36 weight percent lead and the balance tin. As can be seen, the gold addition substantially increases the hardness of bismuth-tin solder alloy at elevated temperatures and produces a hardness comparable to tin-lead alloy within the range of about 110° C. to 150° C. In general, hardness is believed to indicate increased strength, so that tin-bismuth-gold alloy derived from paste in accordance with this invention result in stronger, more durable connections that are better able to withstand temperature excursions of the type experienced by microelectronic packages during use.

Although FIGS. 3 and 4 pertain to gold additions to tin-bismuth alloy, a similar increase in the melting temperature of tin-bismuth alloy is believed to be obtained using silver additions. Accordingly, silver may be suitably substituted to enhance the high temperature property of connections formed of alloys of tin and bismuth.

In the described embodiment, solder paste formulated to contain a gold addition in accordance with this invention was employed for mounting a discrete component to a printed circuit board. During reflow, the metal powders of the solder paste coalesced to form a solder liquid that wet a first faying surface that is the bond pad of the printed circuit board and a second faying surface that is the contact of the component, and, upon cooling, solidified to form the desired solder connection. Although copper and platinum-silver alloy were selected for the faying surfaces, the faying surface may be suitably formed of nickel or any other metal that is solder-wettable so as to produce a strong solder bond. Still further, this invention may be readily adapted to form solder bump connections between a substrate, such as a printed circuit board or ceramic chip carrier, and a bond pad located on an integrated circuit chip.

While this invention has been described in terms of certain embodiments thereof, it is not intended to be limited to the above description, but rather only to the extent set forth in the claims that follow.

The embodiments of the invention which an exclusive property or privilege is claimed are defined as follows:

1. A method for forming a solder connection bonding a first solder-wettable laying surface and a second solder-wettable faying surface, said method comprising arranging said first and second faying surfaces in contact with solder paste to form an assembly, said solder paste comprising a mixture of a first and a second metal powder, said first metal powder being formed of a solder alloy composed predominantly of tin and bismuth and having a melting temperature, said second metal powder comprising a tertiary metal selected from the group consisting of gold and silver in an amount effective to dissolve in said solder alloy to increase the melting temperature thereof, heating the assembly to a temperature effective to melt to solder alloy to form a solder liquid and to dissolve said tertiary metal into the solder liquid, and cooling the assembly to solidify the solder liquid and to form a solder connection bonded to the first and second laying surfaces and composed of a solder alloy containing the tertiary metal and exhibiting an increased melting temperature.

2. A method in accordance with claim 1 wherein the solder alloy comprises between about 30 and 70 weight percent bismuth and the balance substantially tin and wherein the tertiary metal is present in the solder paste is an amount effective to produce a concentration between about 1.0 and 2.2 weight percent in the solder connection.

3. A method in accordance with claim 2 wherein the solder alloy consists essentially of between 48 and 68 weight percent bismuth and tin.

4. A method for forming a solder connection for attaching an electrical component to a printed circuit board, said method comprising applying a deposit of solder paste onto a bond pad of the printed circuit board, said paste comprising a first metal powder and a second metal powder dispersed in a vaporizable vehicle, said first metal powder being formed of a solder alloy composed of between about 30 and 70 weight percent bismuth and tin, said second metal powder being composed substantially of gold, arranging a solder-wettable laying surface of the component in contact with the deposit on the printed circuit board to form an assembly, heating the assembly to vaporize the vehicle and to melt the solder alloy to form a solder liquid, whereupon said second metal powder dissolves into the solder liquid, and cooling the assembly to solidify the solder liquid to form a solder connection bonding the component to the printed circuit board, said solder connection being composed predominantly of tin bismuth solder alloy and containing between about 1.0 and 2.2 weight percent gold.

5. A method in accordance with claim 4, wherein the heating step comprises heating the assembly above about 140° C.

6. A method in accordance with claim 4 wherein the heating step comprises heating the assembly above about 160° C.

* * * * *

UNITED STATES PATENT AND TRADEMARK OFFICE
CERTIFICATE OF CORRECTION

PATENT NO. : 5,429,292
DATED : July 4, 1995
INVENTOR(S) : Cynthia M. Melton, William Beckenbaugh, Dennis Miller It is certified that error appears in the above-identified patent and that said Letters Patent is hereby corrected as shown below:

In the Claims:

At column 5, line 5, "laying" should be --faying--.
At column 5, line 25, "laying" should be --faying--.
At column 6, line 15, "laying" should be --faying--.

Signed and Sealed this

Nineteenth Day of December, 1995

Attest:

BRUCE LEHMAN

Attesting Officer

Commissioner of Patents and Trademarks